(12) United States Patent
Teramoto et al.

(10) Patent No.: US 7,719,911 B2
(45) Date of Patent: May 18, 2010

(54) SEMICONDUCTOR STORAGE DEVICE

(75) Inventors: Kazuhiro Teramoto, Tokyo (JP); Yoji Idei, Tokyo (JP); Takenori Sato, Tokyo (JP); Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 126 days.

(21) Appl. No.: 12/169,873

(22) Filed: Jul. 9, 2008

(65) Prior Publication Data

US 2009/0016139 A1 Jan. 15, 2009

(30) Foreign Application Priority Data

Jul. 11, 2007 (JP) ............................. 2007-182539

(51) Int. Cl.
*G11C 7/00* (2006.01)
(52) U.S. Cl. ...................... 365/206; 365/205; 365/226
(58) Field of Classification Search ................ 365/205, 365/206, 226, 149
See application file for complete search history.

(56) References Cited

U.S. PATENT DOCUMENTS 6,031,779 A * 2/2000 Takahashi et al. ........... 365/226
6,501,692 B1 * 12/2002 Melanson et al. ........... 365/201
6,937,496 B2 * 8/2005 Mizuno et al. .............. 365/115

FOREIGN PATENT DOCUMENTS

JP 2006-193123 7/2006

* cited by examiner

*Primary Examiner*—Son Dinh
(74) *Attorney, Agent, or Firm*—Young & Thompson (57) ABSTRACT

A semiconductor storage device is provided which enables use of an overdrive method at low voltage and for a small device area. The semiconductor device includes: memory cells; sense amplifiers, each having P-channel and N-channel MOS transistors and amplifying a signal read from a memory cell; a first power supply line connected to a source terminal of the P-channel MOS transistor provided in each of the sense amplifiers; a second power supply line which supplies an overdrive voltage to the sense amplifiers at a potential higher than a write potential of the memory cell; a third power supply line connected to an external power supply, a connection element which connects and disconnects the first power supply line and the second power supply line; a capacitance element connected to the second power supply line; and a resistance element inserted between the second power supply line and the third power supply line.

5 Claims, 5 Drawing Sheets

SEMICONDUCTOR STORAGE DEVICE

BACKGROUND OF THE INVENTION

1. Field of the Invention

The present invention relates to a semiconductor storage device having a sense amplifier circuit, and adopting an overdrive method to improve operation speed.

Priority is claimed on Japanese Patent Application No. 2007-182539, filed on Jul. 11, 2007, the contents of which are incorporated herein by reference.

2. Description of Related Art

In conventional semiconductor storage devices such as a dynamic random access memory (DRAM), a sense amplifier performs amplification and rewrite operations of a minute potential difference output to bit lines from a memory cell which stores data. In order to boost the operating speed of sense amplifiers, a method called an overdrive method has been adopted. In the overdrive method, the common source of a PMOS (P-channel metal oxide semiconductor) transistor provided in a sense amplifier is increased to an overdrive voltage, at a potential higher than the write potential (VARY potential or array potential) of a memory cell, to accelerate the sense operation (see Japanese Unexamined Patent Application, First Publication No. 2006-196123 (hereafter referred to as "Patent Reference 1")) . There are a method which employs the voltage of a step-down power supply generated by a power supply generation circuit within the semiconductor storage device as the overdrive voltage, and a method which directly utilizes an external power supply voltage as the overdrive voltage.

In the normal overdrive method, the overdrive time and VARY power supply capacitance are adjusted such that the final write potential for memory cells is assured. If the overdrive voltage is VOD, the final write potential of the memory cells is VARY, the VARY power supply capacitance is Ca, the bit line parasitic capacitance is Cb, the memory cell capacitance is Cs, and the number of sense amplifiers activated simultaneously is n, then the generally employed VARY/2 precharge-type DRAM devices set the VARY power supply capacitance Ca and the overdrive voltage VOD such that the following equation conforming to the charge conservation law obtains.

$$Ca \times VOD + \{(Cs+Cb) \times n\} \times VARY/2 = \{Ca+(Cs+Cb) \times n\} \times VARY$$

In this equation, only the VARY power supply capacitance Ca and the overdrive voltage VOD can be regarded as variables, and the resistor R between power supply lines and overdrive time ta, which are parameters disclosed in embodiments of the present invention described below, are not present. According to this equation, a relation obtains in which in order to reduce the VARY power supply capacitance Ca, the overdrive voltage VOD must be made high, and in order to lower the overdrive voltage VOD, the VARY power supply capacitance Ca must be increased.

In successive generations of DRAM itself, power supply voltages have been lowered to reduce power consumption, and it has become impossible to set a high overdrive voltage VOD. On the other hand, miniaturization has been accompanied by smaller chip areas, and it has become difficult to secure the area necessary for the required VARY power supply capacitance Ca.

In overdrive methods adopted by conventional semiconductor storage devices, there is the problem that a high overdrive power supply potential or a large overdrive capacitance is necessary. The reason for this problem is that overdrive is performed primarily by electric charge accumulated in the overdrive capacitor. If the capacitance value of a capacitance element such as a VARY power supply capacitor is C0, and the potential difference across the ends of the capacitance element is V, then the amount of charge q accumulated in the capacitance element is given by the product of the capacitance value and the potential difference across the ends.

$$q = C0 \times V$$

Hence in order to obtain a constant charge q, the only options are to increase either the capacitance value C0 or the potential difference V. However, due to advances in miniaturization and reduction of power consumption, both the capacitance value C0 and the potential difference V are small. Consequently, the amount of charge q is also small, and appropriate overdrive operation is no longer possible.

SUMMARY OF THE INVENTION

The present invention was made in light of the above circumstances, and an object of the present invention is to provide a semiconductor storage device which enables use of an overdrive method at low voltage and for a small device area.

A semiconductor storage device of the present invention includes: a plurality of memory cells; a plurality of sense amplifiers, each having a P-channel MOS transistor and an N-channel MOS transistor, and amplifying a signal read from a memory cell; a first power supply line connected to a source terminal of the P-channel MOS transistor provided in each of the sense amplifiers; a second power supply line which supplies an overdrive voltage to the sense amplifiers at a potential higher than a write potential of the memory cell; a third power supply line connected to an external power supply; a connection element which connects the first power supply line with the second power supply line and disconnects the first power supply line from the second power supply line; a capacitance element connected to the second power supply line; and a resistance element inserted between the second power supply line and the third power supply line.

The resistance value of the resistance element can for example be set to a value which is determined based on the capacitance value of the capacitance element and on a desired time from when the connection element connects the first power supply line with the second power supply line to when the voltage on the first power supply line (or on the second power supply line) is changed to a desired voltage value such as the write potential of the memory cell.

Preferably, in the semiconductor storage device of the present invention, the resistance element is a passive element.

Preferably, in the semiconductor storage device of the present invention, the resistance element is an active element.

Preferably, in the semiconductor storage device of the present invention, the active element is a transistor.

Preferably, in the semiconductor storage device of the present invention, the resistance value R of the resistance element and the capacitance value C of the capacitance element are set so as to satisfy the equation $VARY = VDDSA - (VDDSA - Va) \times \exp[-ta/\{(Cd+C) \times R\}]$, where the write potential of the memory cell is VARY, the voltage of the third power supply line is VDDSA, the potential of the second power supply line immediately after the connection element has disconnected the first power supply line from the second power supply line is Va, a desired time required to change the potential of the first power supply line to the write potential of the memory cell is ta, and the capacitance of a sense amplifier is Cd.

By means of the above configuration, the resistance value of the resistance element and the capacitance value of the capacitance element can be adjusted appropriately in accordance with the desired overdrive time, and thus an overdrive method can easily be executed at a low voltage and for a small device area. Furthermore, by making the resistance element a passive element, the configuration can be simplified. On the other hand, by making the resistance element a transistor (an active element), the turn-on resistance can be adjusted dynamically.

DETAILED DESCRIPTION OF THE INVENTION

Below, embodiments of the present invention are explained in detail referring to the drawings.

Figure 1:
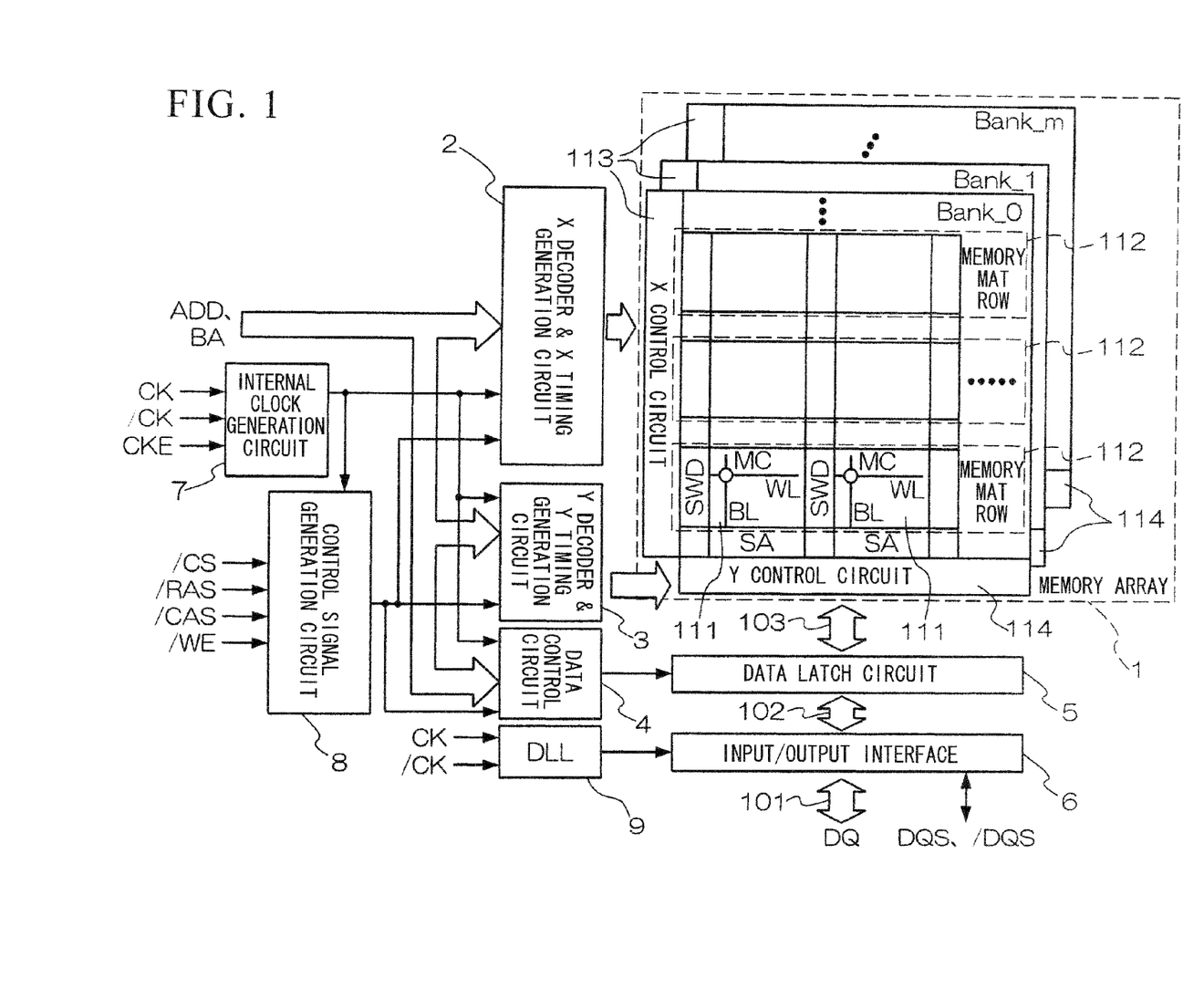
FIG. 1 is a block diagram showing the overall configuration of DRAM to which the present invention is applied.

FIG. 1 is a block diagram showing the overall configuration of ordinary DRAM. This DRAM comprises a memory array 1; an X decoder & X timing generation circuit 2; a Y decoder & Y timing generation circuit 3; a data control circuit 4; a data latch circuit 5; an input/output interface 6; an internal CLK (clock) generation circuit 7; a control signal generation circuit 8; and a DLL (Delay Locked Loop) circuit 9.

The memory array 1, the data latch circuit 5, and the input/output interface 6 are connected by data transfer buses 101 to 103, and data transfer is controlled by the data control circuit 4. Data output timing to external equipment (not shown) such as in a data input/output (DQ), a data strobe input/output (DQS, /DQS) is controlled by the DLL circuit 9.

On the other hand, the memory array 1 is controlled by the X decoder & X timing generation circuit 2 and by the Y decoder & Y timing generation circuit 3. The X decoder & X timing generation circuit 2 and the Y decoder & Y timing generation circuit 3 are controlled by the control signal generation circuit 8.

The memory array 1 shown in FIG. 1 includes m+1 banks (Bank_0, Bank_1, . . . , Bank_m). Each bank includes a plurality of memory mat rows 112. In each memory mat row 112, a plurality of memory mats 111 are arranged. Each memory mat 111 includes a plurality of memory cells MC provided at the intersections of a plurality of word lines WL and a plurality of bit lines BL. In each of the banks are arranged an X control circuit 113 and a Y control circuit 114. Each memory mat 111 is surrounded by a sense amplifier (SA) area, including a plurality of sense amplifiers used for amplification of data read from memory cells MC, and by a sub-word driver (SWD) area, including a plurality of sub-word drive circuits which drive a plurality of word lines WL.

In FIG. 1, CK and /CK are clock inputs, CKE is a clock enable input, /CS is a chip select input, /RAS is a row address strobe input, /CAS is a column address strobe input, /WE is a write enable input, ADD is an address input, and BA is a bank address input.

Figure 2:
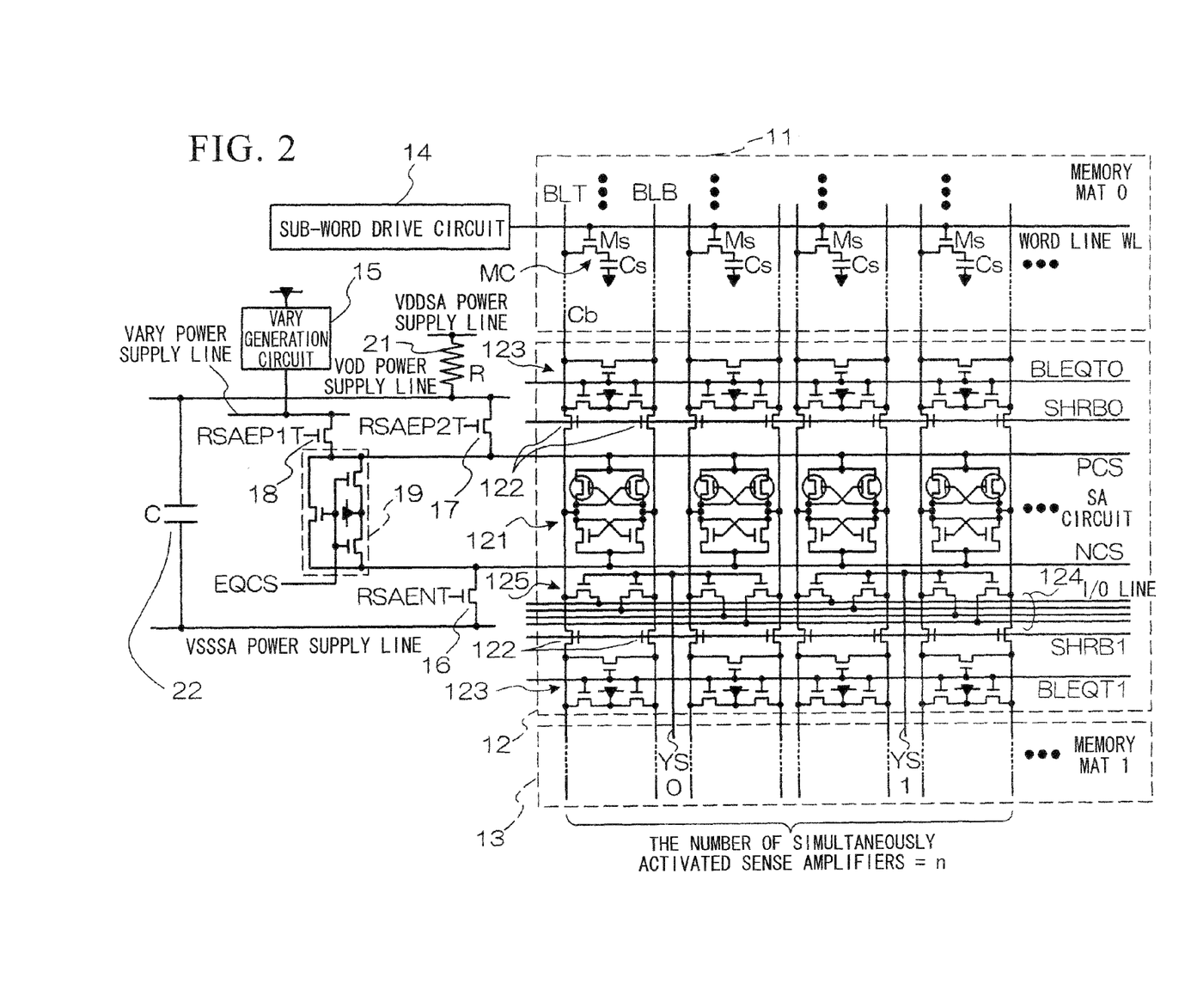
FIG. 2 is a block diagram showing an example of application of a first embodiment of the present invention to the memory array 1 shown in FIG. 1.

FIG. 2 shows an example of application of the first embodiment of the present invention to the memory array 1 shown in FIG. 1. As a sense amplifier circuit 12, FIG. 2 shows a widely used shared-type sense amplifier circuit which is shared by a plurality of memory mats, that is, a memory mat 0 (reference symbol 11) and a memory mat 1 (reference symbol 13). However, as the sense amplifier circuit 12, an open-type sense amplifier circuit, in which a pair of bit lines BLT and BLB belong to the memory mat 0 (11) and to the memory mat 1 (13) respectively, may also be used.

A sub-word drive circuit 14 selects one word line WL from among the plurality of word liens WL provided in the memory mats 11 and 13. Memory cells MC are arranged at the intersections of the word lines WL and the bit lines BLT or BLB. Each memory cell MC includes a selection transistor Ms and a data storage capacitor Cs.

The sense amplifier circuit 12 has a plurality of sets (n sets) of a sense amplifier 121, including two PMOS transistors and two NMOS (N-channel metal oxide semiconductor) transistors; a plurality of shared transistors 122, connecting the sense amplifier 121 to bit lines BLT and BLB provided in the memory mats 11 and 13; a precharge circuit 123, which precharges the bit lines BLT and BLB to a prescribed potential during DRAM precharging; I/O lines 124, which transfer data read on the bit lines BLT and BLB to outside the memory array; and a plurality of transistors 125, controlled by Y selection signals YS0, YS1, . . . , to connect the bit lines BLT and BLB to the I/O lines 124. The bit line parasitic capacitance appearing on the bit lines BLT and BLB is Cb.

In the plurality of sense amplifiers 121 provided in the sense amplifier circuit 12, the source terminals of the PMOS and NMOS transistors are connected in common to respective source power supply lines. By driving the shared source power supply lines PCS and NCS, all of the n sense amplifiers 121 arranged along the source power supply lines can be driven simultaneously. When the DRAM is in the precharged state, the source power supply lines PCS and NCS are precharged to the same potential using an EQCS circuit 19. A transistor 16 drives the common source power supply line NCS connected to the NMOS transistors provided in the sense amplifiers 121. An RSAENT signal is input to the gate of the transistor 16, and a VSSSA power supply line is connected to the source of the transistor 16. The common source power supply line PCS connected to the PMOS transistors provided in the sense amplifier 121 is connected to a transistor 18 which takes an RSAEP1T signal as input to the gate and which uses the VARY power supply line as the source power supply. The common source power supply line PCS is also connected to a transistor 17 which takes an RSAEP2T signal, which is an overdrive control signal, as input to the gate, and which uses the VOD power supply line as the source power supply. The VARY power supply line is connected to a VARY generation circuit 15, which generates the VARY potential (array potential), which is the final write potential when a high signal is written into a memory cell MC. A resistor (resistance element) 21 of resistance value R is inserted between the VOD power supply line supplying the overdrive voltage VOD and the VDDSA power supply line, which is an external power supply. A VOD power supply capacitor 22 of capacitance value C is placed between the VOD power supply line and the VSSSA power supply line. The VOD power supply capacitor 22 is not due to parasitic capacitance; instead, a separate capacitance element is formed.

Explanation of Operation of the Embodiment

Figure 3:
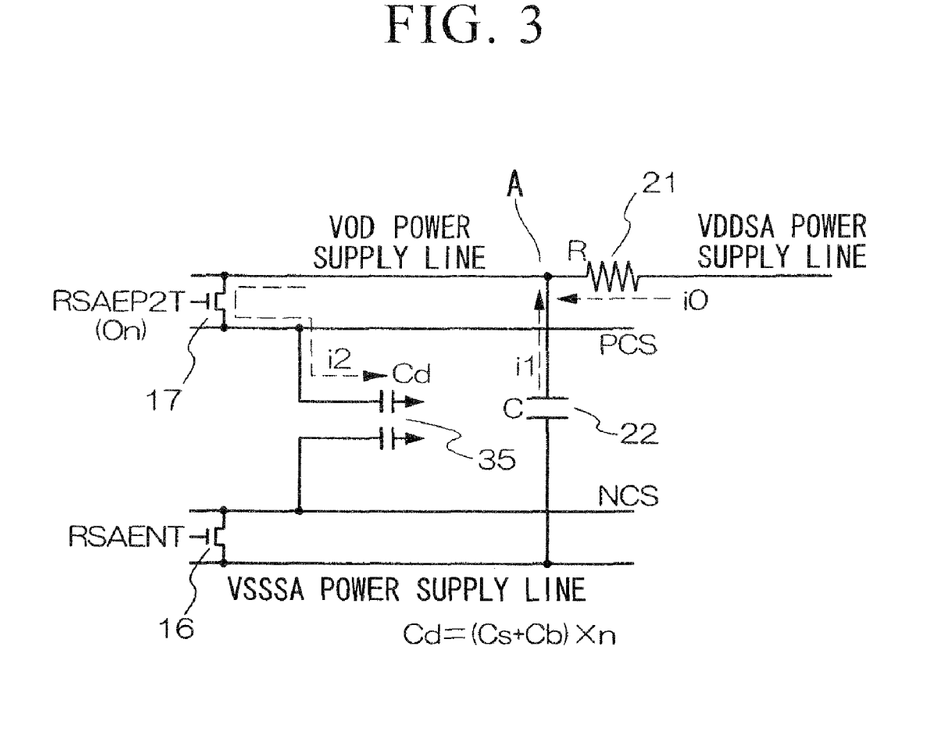
FIG. 3 is a schematic diagram showing in summary the control circuit of the sense amplifier circuit 12 shown in FIG. 2.

Next, the operation of the overdrive method in accordance with the present embodiment of the present invention is explained with reference to FIG. 3. FIG. 3 is a schematic diagram showing in summary the control circuit of the sense amplifier circuit 12 shown in FIG. 2. The circuit portions, which are not features of the present embodiment of the present invention, are omitted in FIG. 3. If the capacitor 35 which is charged by the sense amplifier 121 (omitted in FIG. 3) connected to the source power supply line PCS is Cd, then as seen from FIG. 2, the following relationship obtains.

$$Cd=(Cs+Cb)\times n \quad (1)$$

When the overdrive control signal RSAEP2T goes to a high level, the NMOS transistor 17 is turned on, a current i2 flows from the VOD power supply line, and the capacitor Cd is charged. Applying Kirchhoff's laws to the connection point A at which the resistor 21 and the VOD power supply capacitor 22 are connected, the current i2 is expressed as the sum of the current i1 discharged from the VOD power supply capacitor 22 and the current i0 supplied from the VDDSA power supply line via the resistor 21, so that the following relationship obtains.

$$i2=i0+i1 \quad (2)$$

Here, the resistance value R of the resistor 21 is set to be sufficiently high relative to the turn-on resistance of the transistor 17. Immediately after the transistor 17 is turned on, the discharge current i1 from the VOD power supply capacitor 22 is dominant, so that the above equation may be approximated as follows.

$$i2=i1 \quad (3)$$

That is, immediately after the transistor 17 is turned on, capacitive coupling between the capacitor 35 and the capacitor 22 can be assumed. If the potential of the source power supply line PCS after capacitive coupling is Va, then from the charge conservation law, the following relationship obtains.

$$C\times VDDSA+Cd\times VARY/2=(C+Cd)\times Va \quad (4)$$

Thereafter, the capacitor 35 and the VOD power supply capacitor 22 are charged by the VDDSA power supply through the resistor 21.

Figure 4:
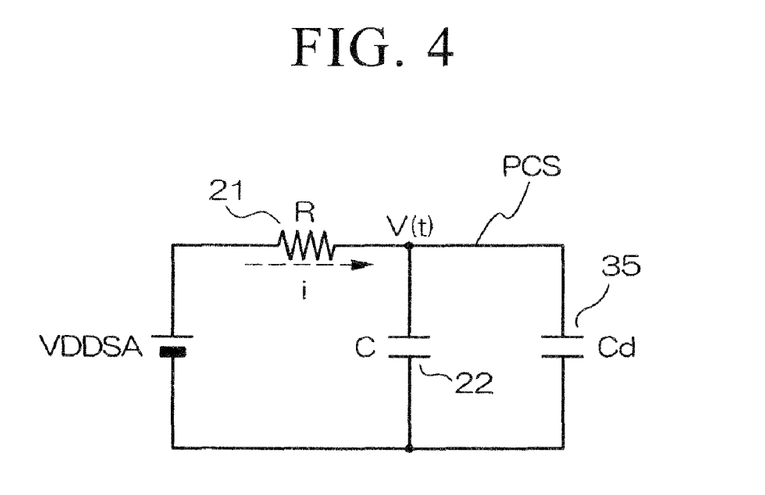
FIG. 4 is a diagram showing an equivalent circuit in the state after capacitive coupling of the capacitor 35 of the sense amplifier circuit 12 and the VOD power supply capacitor 22 shown in FIG. 3.

Operation after capacitive coupling, that is, immediately after the transistor 17 is turned on, is explained using FIG. 4. FIG. 4 is an equivalent circuit showing the state after capacitive coupling of the capacitor 35 and the VOD power supply capacitor 22 shown in FIG. 3. These two capacitors are charged through the resistor with resistance value R. The initial potential of the common source power supply line PCS is Va determined by the above charge conservation law (equation (4)). If the potential of the common source power supply line PCS at a given time t is V(t), then from Kirchhoffs laws, the following relationship obtains.

$$\{VDDSA-V(t)\}/R=(Cd+C)\times dV(t)/dt \quad (5)$$

The solution to this differential equation is given by the following equation.

$$V(t)=VDDSA+A\times \exp[-t/\{(Cd+C)\times R\}] \quad (6)$$

When t=0, V(0)=Va, so that the following equation obtains.

$$A=-VDDSA+Va \quad (7)$$

Therefore, finally the following equation obtains.

$$V(t)=VDDSA-(VDDSA-Va)\times \exp[-t/\{(Cd+C)\times R\}] \quad (8)$$

When after time ta the potential of the common source power supply line PCS is made the VARY potential, the following relationship obtains.

$$\begin{aligned}V(ta) &= VARY \\ &= VDDSA - (VDDSA - Va)\times \exp[-ta/\{(Cd+C)\times R\}]\end{aligned} \quad (9)$$

Figure 5:
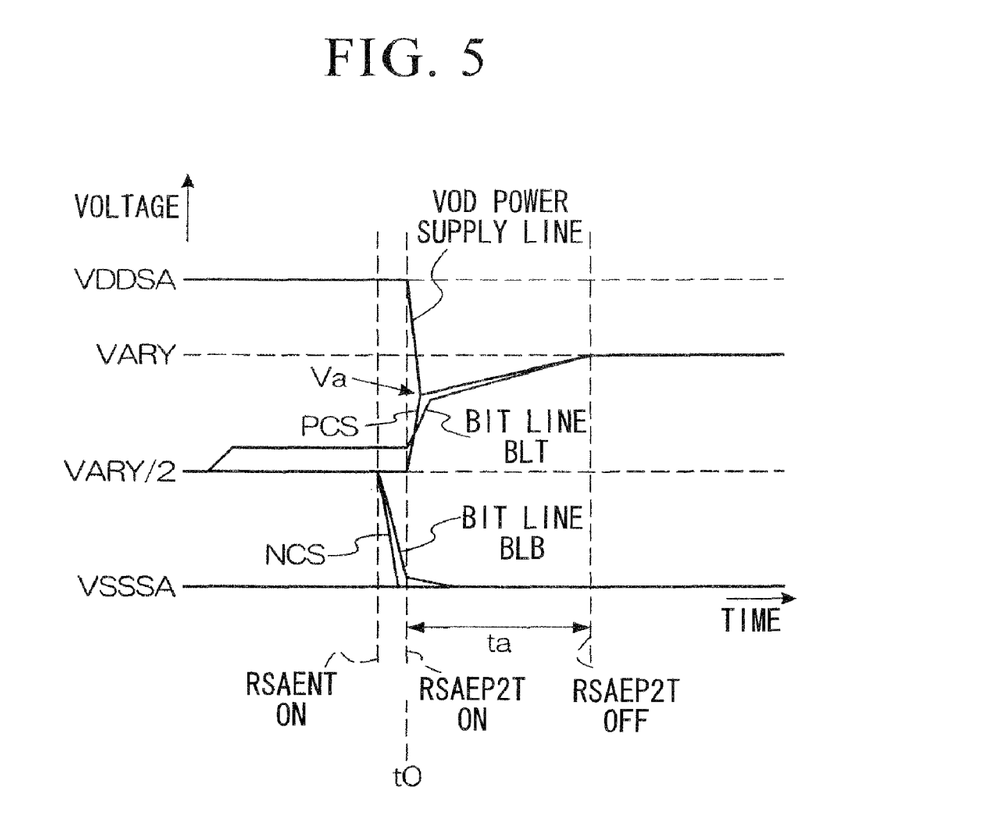
FIG. 5 is a diagram showing operating waveforms of the first embodiment shown in FIG. 2; and, FIG. 6 is a block diagram showing an example of application of a second embodiment of the present invention to the memory array 1 shown in FIG. 1.

Appropriate overdrive is possible by adjusting the resistance value R and the time ta, which is the time until the potential of the common source power supply line PCS (or the potential of the VOD power supply line) reaches the VARY potential, so as to satisfy equation (9) even when the capacitance value C of the VOD power supply capacitor 22 is small and moreover the VDDSA power supply is at low potential. FIG. 5 shows waveforms for the above operation.

FIG. 5 is diagram showing waveforms used to explain operation when the potential of the common source power supply line PCS is raised to the VARY potential, in the configuration shown in FIG. 2. First, the RSAENT signal is set to a high level (on), turning the transistor 16 on, and the bit line BLB is held at VSSSA potential. At a prescribed time t0 after the turn-on time for the transistor 16 has elapsed after setting the RSAENT signal to a high level, the transistor 17, which connects the VOD power supply line to the common source power supply line PCS, is turned on (the RSAEP2T signal is set to a high level (on)), In the state prior to turning on the transistor 17, the VOD power supply capacitor 22 (capacitance value C) is charged to the supply voltage of the VDDSA power supply line, and the current in the resistor 21 has dropped to zero.

When the transistor 17 is turned on, the source power supply line PCS and the VOD power supply line are connected, and the VOD power supply capacitor 22 (capacitance value C) and the charging capacitor 35 of the sense amplifier (capacitance value Cd) are coupled. As a result, immediate after time t0 (after the turn-on time for the transistor 17 has elapsed), the potential of the source power supply line PCS (=potential of the VOD power supply line) rises to a potential Va (or drops to the potential Va, relative to the VOD power supply line) determined by the coupled capacitance of the capacitance C of the VOD power supply capacitor 22 and the capacitance Cd of the charging capacitor 35 of the sense amplifier. Thereafter, the capacitor 35 (capacitance value Cd) and the VOD power supply capacitor 22 (capacitance value C) are charged by the VDDSA power supply through the resistor 21. After a prescribed time ta passes and the potential of the source power supply line PCS (=potential of the VOD power supply line) reaches the desired value (a value in the vicinity of the write potential VARY), overdrive operation is ended by setting the RSAEP2T signal to a low level (off).

Next, a specific example of a resistance value R and a capacitance value C is explained. If for example Cb=50 fF, Cs=25 fF, and the number of simultaneously activated sense amplifiers n=8192, then from equation (1), a capacitance of the following equation must be charged.

$$Cd=(25+50)\times 8192=614.4 \text{ pF}$$

When VDDSA=1.5 V and VARY=1.0 V, the required overdrive power supply capacitance (overdrive capacitance) C is obtained from the simple charge conservation law, as shown below.

$$C\times 1.5[V]+614.4[pF]\times 0.5[V]=(C+614.4[pF])\times 1.0$$

Solving this equation yields the following equation.

$$C=614.4[pF]$$

In conventional semiconductor storage devices, this capacitance is necessary; however, considering a reduction by, for example, 60% of this capacitance from the standpoint of reducing the chip area, then from equation (4), the following equation obtains.

$$614.4[pF]\times0.6\times1.5[V]+614.4[pF]\times0.5[V]=(614.4[pF]+614.4[pF])\times Va$$

Solving this equation gives the following.

$$Va=0.7[V]$$

When it is desired to set the overdrive time to 10 ns, upon solving the following equation obtained from equation (9) for R.

$$1.0[V]=1.5[V]-(1.5[V]-0.7[V])\times\exp\{-10[ns]/(614.4[pF]+614.4[pF]\times0.6)/R\}$$

the following equation obtains.

$$R=21.6[Ohms]$$

In this example, the optimum resistance value R is calculated when the overdrive power supply capacitance C and the overdrive time are set. By inserting a resistance element having the resistance value R, the size of the overdrive power supply capacitor can be reduced, and the chip area can be made smaller. Such a resistance value can be achieved through the use of tungsten wiring or N+diffusion-layer resistance. The required capacitance can be achieved by using conventional gate capacitance.

A somewhat more generalized case is considered. When VDDSA=1.5 V, VARY=1.0 V, and Cd=614.4 pF, substituting equation (4) into equation (9) to cancel Va and rearranging gives the following equation.

$$\exp\{-10[ns]/(C+614.4[pF])/R\}-C/1228.8[pF]+0.5$$

This indicates the point of intersection between the following functions with respect to the capacitance C.

$$y=\exp\{-10[ns]/(C+614.4[pF])/R\}$$

$$y'=C/1228.8[pF]+0.5$$

These functions can be graphed, and the optimal values of R and C can be computed.

Advantageous Effects

A first advantageous effect is the fact that effective overdrive performance is possible even at a low overdrive voltage and small overdrive power supply capacitance. This is because overdrive operation is performed using two current sources, which are the overdrive power supply capacitor C and the external overdrive power supply VDDSA. Patent Reference 1 discloses a method in which a capacitor is used for overdrive. However, in this method, overdrive is performed using only the charge on the capacitor, so that a large capacitance is required.

A second advantageous effect is that an adequate operating margin can be obtained even for a memory array with a low final write potential VARY. In memory cells with a low write voltage, the potential at which data is read to bit lines from memory cells is also low, so that the margin of the sense amplifier sensitivity is narrow. On the other hand, the sense amplifier sensitivity is determined primarily by variance in the current performance between the two PMOS transistors or between the two NMOS transistors provided in the sense amplifier. This variance is generally larger for PMOS transistors than for NMOS transistors, and the minimum potential difference which can be sensed (the sensing limit) by the sense amplifier is determined by the contention between performance of the NMOS transistors, which tend to perform correct sensing, and the PMOS transistors, which tend to sense incorrectly. As explained above, in the overdrive method in accordance with the present embodiment of the present invention, the resistor 21 is inserted, and hence a design is possible which reduces the overdrive power supply capacitor C. As can be understood from equation (4), the potential of the common source power supply lines PCS of the PMOS transistors can be lowered in the initial sensing period. This has the advantageous effect of reducing the current performance of the PMOS transistors. As a result, the sensing limit is lowered.

A third advantageous effect is that, during operation to recharge the overdrive power supply capacitor C, noise generated by writing a low level to memory cells can be reduced. Because the overdrive power supply capacitor C discharges accumulated charge during overdrive operation, recharging must be performed before the overdrive power supply capacitor C is used in the next cycle. In general, one of the terminals of the overdrive power supply capacitor C is connected to the VOD power supply line, and the other terminal thereof is connected to the VSSSA power supply line. After the completion of overdrive operation, when the VOD power supply line and the PMOS TO source power supply line PCS are disconnected, the bit line capacitor Cb and the memory cell capacitor Cs are separated from the VOD power supply line. As a result, the load on the VOD power supply line is reduced, and the speed with which the potential of the VOD power supply line is restored to the VDDSA potential is hastened. At this time, the potential of the opposing-electrode of the overdrive power supply capacitor C is increased due to displacement current flowing from the VDDSA power supply line to the overdrive power supply capacitor C. Due to this increase, a low level in the memory cell rises. The increased potential is proportional to the displacement current flowing in the overdrive power supply capacitor. That is, the larger the capacitance value, the greater is the loss. As explained above, the present embodiment of the present invention can decrease the overdrive power supply capacitance C, so that this loss can be kept small.

Other Embodiments of the Present Invention

Next, a second embodiment of the present invention is explained in detail, referring to the drawings.

Figure 6:
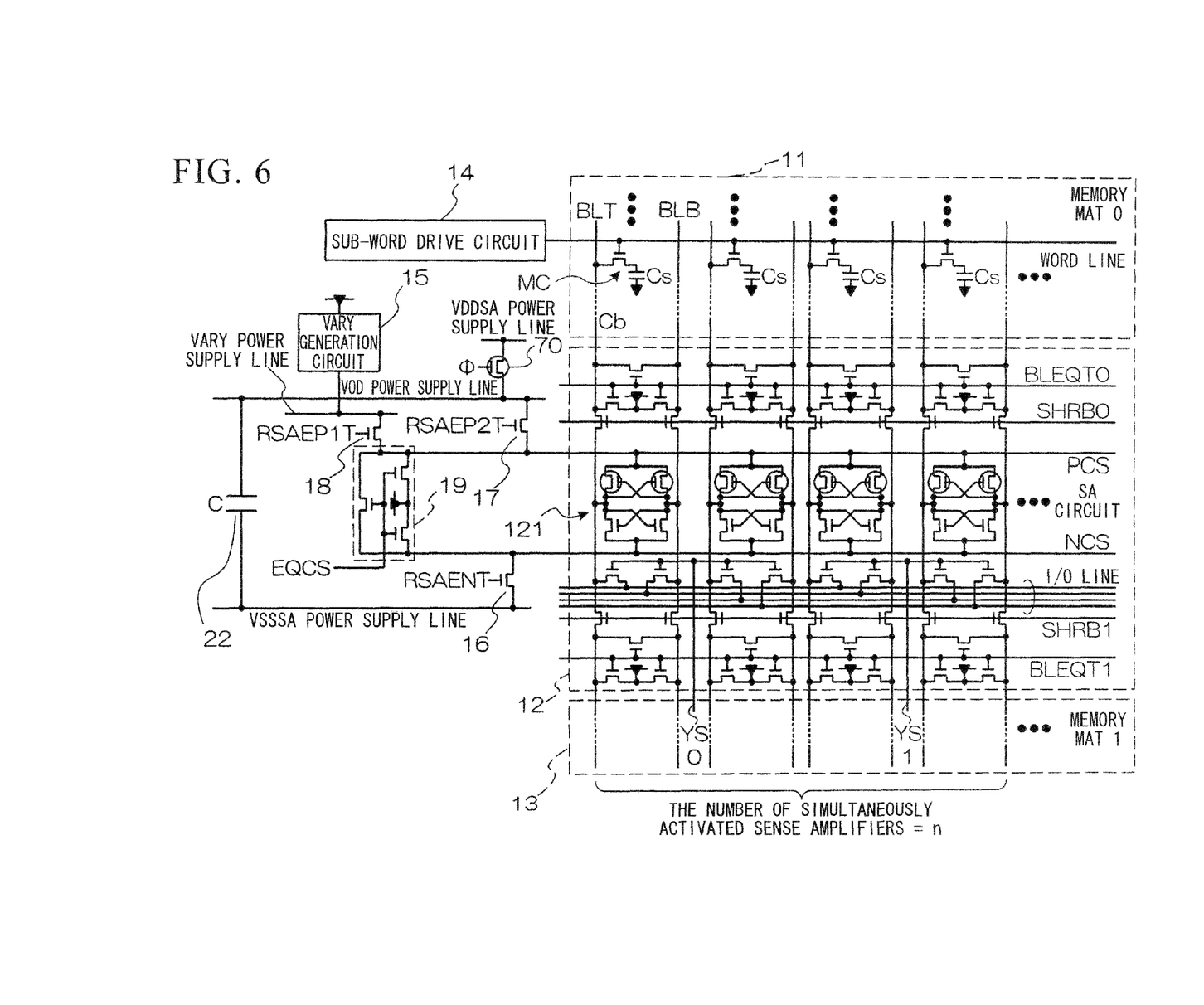

FIG. 6 is a block diagram showing an example in which the second embodiment of the present invention is applied to the memory array 1 of FIG. 1. In the first embodiment, a resistance element is used as the element between the VDDSA power supply line and the VOD power supply line. In the present embodiment, a transistor 70, with a signal Φ input to the gate, is used instead. In FIG. 6, an embodiment is shown in which the transistor 70 is a PMOS transistor, but an NMOS transistor may be used as well. In FIG. 6, the same reference symbols are used for components which are the same as or correspond to components in FIG. 2.

In the case of the configuration of the present embodiment, the resistance between the source and the drain (hereinafter referred to as the "source-drain resistance") of the transistor 70 corresponds to the resistance value R in equation (9). By using the transistor 70, the source-drain resistance becomes a variable resistance conforming to the gate voltage. Therefore, by adjusting the gate voltage, fine adjustment of the resistance value is possible, in contrast with the case in which a resistance element 21 is used. Furthermore, by raising the potential of the signal Φ after the overdrive operation period to increases the resistance value, the displacement current flowing in the overdrive power supply capacitor C during recharging of the overdrive power supply capacitor C can be reduced. Through this advantageous effect, the loss when writing a low level to memory cells MC can be farther reduced.

Embodiments of the present invention are not limited to those described above, and for example both a transistor 70 and a resistance element 21 may be provided.

The correspondence between the claims and the configuration of embodiments is as follows.

"A first power supply line connected to a source terminal of the P-channel MOS transistors provided in each of the sense amplifiers" corresponds to the "PCS power supply line"; "a second power supply line which supplies an overdrive voltage to the sense amplifiers at a potential higher than a write potential of the memory cell" corresponds to the "VOD power supply line"; "a third power supply line connected to an external power supply" corresponds to the "VDDSA power supply line"; "a connection element which connects the first power supply line with the second power supply line and disconnects the first power supply line from the second power supply line" corresponds to the "transistor 17"; "a capacitance element connected to the second power supply line" corresponds to "VOD power supply capacitor 22"; and, "a resistance element inserted between the second power supply line and the third power supply line" corresponds to the resistor (resistance element) R or to the transistor 70.

While preferred embodiments of the present invention have been described and illustrated above, it should be understood that these are exemplary of the present invention and are not to be considered as limiting. Additions, omissions, substitutions, and other modifications can be made without departing from the gist or scope of the present invention. Accordingly, the present invention is not to be considered as being limited by the foregoing description, and is only limited by the scope of the appended claims.

What is claimed is:

1. A semiconductor storage device comprising:
   a plurality of memory cells;
   a plurality of sense amplifiers, each having a P-channel MOS transistor and an N-channel MOS transistor, and amplifying a signal read from a memory cell;
   a first power supply line connected to a source terminal of the P-channel MOS transistor provided in each of the sense amplifiers;
   a second power supply line which supplies an overdrive voltage to the sense amplifiers at a potential higher than a write potential of the memory cell;
   a third power supply line connected to an external power supply;
   a connection element which connects the first power supply line with the second power supply line and disconnects the first power supply line from the second power supply line,
   a capacitance element connected to the second power supply line; and
   a resistance element inserted between the second power supply line and the third power supply line.

2. The semiconductor storage device as recited in claim 1, wherein the resistance element is a passive element.

3. The semiconductor storage device as recited in claim 1, wherein the resistance element is an active element.

4. The semiconductor storage device as recited in claim 3, wherein the active element is a transistor.

5. The semiconductor storage device as recited in claim 1, wherein the resistance value R of the resistance element and the capacitance value C of the capacitance element are set so as to satisfy the equation $$\text{VARY} = VDDSA - (VDDSA - Va) \times \exp[-ta/\{(Cd+C) \times R\}],$$

where the write potential of the memory cell is VARY, the voltage of the third power supply line is VDDSA, the potential of the second power supply line immediately after the connection element has disconnected the first power supply line from the second power supply line is Va, a desired time required to change the potential of the first power supply line to the write potential of the memory cell is ta, and the capacitance of a sense amplifier is Cd.

* * * * *